United States Patent
Hintermaier (10) Patent No.: US 6,693,318 B1
(45) Date of Patent: Feb. 17, 2004

(54) REDUCED DIFFUSION OF A MOBILE SPECIE FROM A METAL OXIDE CERAMIC

(75) Inventor: Frank S. Hintermaier, Munich (DE)

(73) Assignee: Infineon Technologies North America, San Jose, CA (US)

(*) Notice: Subject to any disclaimer, the term of this patent is extended or adjusted under 35 U.S.C. 154(b) by 0 days.

(21) Appl. No.: 09/216,372

(22) Filed: Dec. 18, 1998

Related U.S. Application Data (63) Continuation-in-part of application No. 09/216,370, filed on Dec. 18, 1998.
(60) Provisional application No. 60/068,040, filed on Dec. 18, 1997.

(51) Int. Cl.$^7$ .................................. H01L 27/108
(52) U.S. Cl. .................. 257/306; 257/295; 257/309; 257/310; 438/3; 438/240; 438/253; 438/396
(58) Field of Search ................. 257/295, 296, 257/306, 309, 310; 438/3, 240, 253, 396

(56) References Cited

U.S. PATENT DOCUMENTS

| 5,418,388 | A | * | 5/1995 | Okudaira et al. | 257/295 |
| 5,489,548 | A | * | 2/1996 | Nishioka et al. | 438/396 |
| 5,854,104 | A | * | 12/1998 | Onishi et al. | 438/240 |
| 5,923,970 | A | * | 7/1999 | Kirlin | 438/240 |
| 6,120,846 | A | * | 9/2000 | Hintermaier et al. | 427/269 |
| 6,204,158 | B1 | * | 3/2001 | Hendrix et al. | 438/563 |
| 6,214,474 | B1 | * | 4/2001 | Barbist et al. | 428/469 |
| 6,350,643 | B1 | * | 2/2002 | Hintermaier et al. | 438/240 |
| 6,358,810 | B1 | * | 3/2002 | Dornfest et al. | 438/396 |

* cited by examiner

Primary Examiner—Amir Zarabian
Assistant Examiner—Toniae M. Thomas (57) ABSTRACT

A barrier layer is provided to prevent the diffusion of excess mobile specie from a metal oxide ceramic into the substrate. The barrier layer is provided below the metal oxide ceramic, separating it from the substrate below.

6 Claims, 8 Drawing Sheets

REDUCED DIFFUSION OF A MOBILE SPECIE FROM A METAL OXIDE CERAMIC

This is a continuation-in-part of U.S. patent application Ser. No. 09/216,370 titled "REDUCED DEGRADATION OF METAL OXIDE CERAMIC DUE TO DIFFUSION OF A MOBILE SPECIE THEREFROM" filed on Dec. 18, 1998. This application claims the priority of provisional application U.S. Ser. No. 60/068,040, which was filed on Dec. 18, 1997.

FIELD OF THE INVENTION

The invention relates generally to metal oxide ceramic films used in integrated circuits (ICs). More particularly, the invention relates to reducing diffusion of a mobile specie into the substrate.

BACKGROUND OF THE INVENTION

Metal oxide ceramic materials have been investigated for their use in ICs. For example, metal oxide ceramics that are ferroelectrics or are capable of being transformed into ferroelectrics are useful due to their high remanant polarization (2Pr) and reliable long-term storage characteristics. Non-ferroelectric metal oxide ceramics, such as superconductors, have also been investigated.

Various techniques, such as sol-gel, chemical vapor deposition (CVD), sputtering, or pulsed laser deposition (PLD), have been developed for depositing ferroelectric films on a substrate. Such techniques, for example, are described, for example, Budd et al., Brit. Ceram. Soc. Proc., 36, p107 (1985); Brierley et al., Ferroelectrics, 91, p181 (1989), Takayama et al., J. Appl. Phys., 65, p1666 (1989); Morimoto et al., J. Jap. Appl. Phys. 318, 9296 (1992); and co-pending U.S. patent applications Ser. Nos. 08/975,087, titled "Low Temperature CVD Process using B-Diketonate Bismuth Precursor for the Preparation of Bismuth Ceramic Thin Films for Integration into Ferroelectric Memory Devices," U.S. Ser. No. 09/107,861, titled "Amorphously Deposited Metal Oxide Ceramic Films," all of which are herein incorporated by reference for all purposes.

Metal oxide ceramics are often treated with a post-deposition thermal process at a relatively high temperature in order to produce resulting materials with the desired electrical characteristics. For example, some Bi-based oxide ceramics such as strontium bismuth tantalate (SBT) are thermally treated by a "ferroanneal." The ferroanneal converts the as-deposited films into the ferroelectric phase. After the as-deposited films are converted into the ferroelectric phase, the ferroanneal continues, growing the grain size (e.g., greater than about 180 nm) of the films in order to achieve a good remanent polarization. Other types of metal oxide ceramics can be deposited as ferroelectrics. For example, lead zirconium titanate (PZT) is often deposited at a relatively higher temperature, such as greater than 500° C., to form an as-deposited film with a ferroelectric perovskite phase. Although the PZT is deposited as a ferroelectric, a post-deposition thermal process is often still needed to improve its electrical characteristics.

Typically, the metal oxide ceramics comprise a mobile specie. The high temperature of the post-deposition heat treatment causes diffusion of the mobile specie out of the metal oxide ceramic layer. The amount of mobile specie that diffuses out of the metal oxide ceramic layer is referred to as an "excess mobile specie." The mobile specie can be in the form of atoms, molecules, or compounds. Diffusion of the excess mobile specie can have an adverse impact on yields.

The excess mobile specie can easily migrate into other regions of the IC, such as the substrate, during the post deposition heat treatment. This can result in shorts and/or alter the electrical properties of other device regions, such as the diffusion regions.

As evidenced by the foregoing discussion, it is desirable to counteract the, adverse effects caused by diffusion of an excess mobile specie from a metal oxide ceramic layer.

SUMMARY OF THE INVENTION

The invention relates to metal oxide ceramic films and their applications in ICs. More particularly, the invention reduces the diffusion of an excess mobile specie from a metal oxide ceramic into the substrate.

In accordance with the invention, a barrier layer is provided. The barrier layer serves as a diffusion barrier to reduce or minimize the diffusion of the excess mobile specie. In one embodiment, the barrier layer is provided on a substrate separating the metal oxide ceramic and the substrate.

In one embodiment, the barrier comprises a material that reacts with the mobile specie. The reaction traps the mobile specie, preventing it from passing through the barrier layer. In another embodiment, the barrier layer comprises a dense material in order to inhibit the passage of the mobile specie. Also, a barrier layer comprising an amorphous material or a material with very small grain size is useful. Such materials extend the diffusion pathways of the mobile specie, making it more difficult for the mobile specie to diffuse through.

In another embodiment, the barrier layer comprises a grain surface having little or no attractive interaction with the mobile specie. Alternatively, a barrier comprising a grain surface having a strong interaction with the mobile specie and high activation energy for the mobile specie to migrate is also useful.

In yet another embodiment, the stoichiometry or composition of the metal oxide ceramic is selected to reduce or minimize diffusion of the mobile specie without adversely affecting the electrical properties of the material. Additionally, the deposition parameters of the metal oxide ceramic can be controlled to reduce the diffusion of the excess mobile specie from the metal oxide ceramic. In one embodiment, the ratio of oxidizer to the precursor amount of oxidizer is reduced to reduce diffusion of the mobile specie.

DETAILED DESCRIPTION OF THE INVENTION

The invention relates to metal oxide ceramic films and their applications in ICs. More particularly, the invention relates to reducing the adverse effects resulting from diffusion of an excess mobile specie from a metal oxide ceramic.

For purposes of illustration, the invention is described in the context of a ferroelectric memory cell and a ferroelectric transistor. However, the invention is applicable to the formation of metal oxide ceramics in general. Other applications, such as a ferroelectric transistor comprising a metal oxide ceramic layer, are also useful. Ferroelectric transistors are described in, for example, Miller and McWhorter, "Physics of ferroelectric non-volatile memory field effect transistor," J. Appl. Physics, 73(12), p 5999–6010 (1992); and co-pending U.S. patent application Ser. No. 09/107,861, titled "Amorphously Deposited Metal Oxide Ceramic Films," which are herein incorporated by reference for all purposes.

Figure 1:
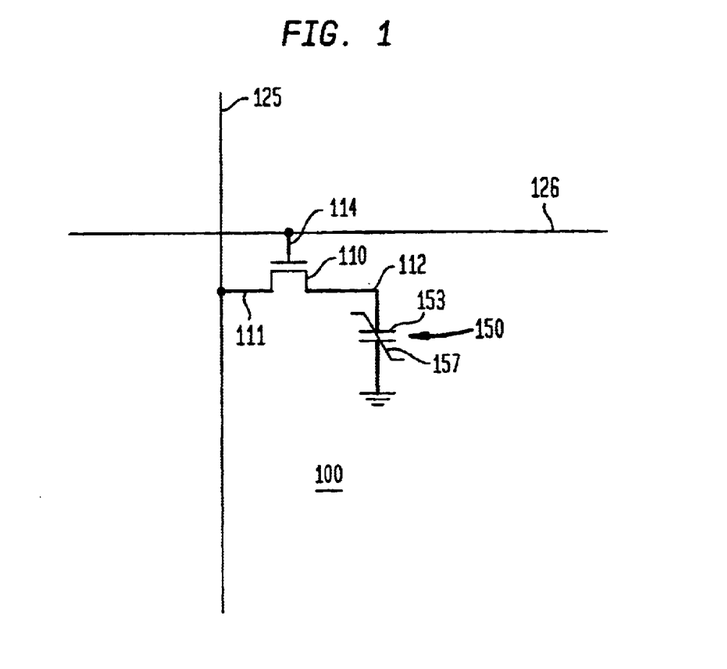
FIG. 1 shows a schematic diagram of an illustrative embodiment of the invention.

Referring to FIG. 1, a schematic diagram of a ferroelectric memory cell 100 is shown. As shown, the memory cell comprises a transistor 110 and a ferroelectric capacitor 150. A first electrode 111 of the transistor is coupled to the bitline 125, and a second electrode 112 is coupled to the capacitor. A gate electrode of the transistor is coupled to the wordline 126.

The ferroelectric capacitor comprises first and second plates 153 and 157 separated by a ferroelectric layer. The first plate 153 is coupled to the second electrode of the transistor. The second plate typically serves as a common plate in the memory array.

A plurality of memory cells is interconnected with wordlines and bitlines to form an array in a memory IC. Access to the memory cell is achieved by providing the appropriate voltages to the wordline and bitline, enabling data to be written or read from the capacitor.

Figure 2:
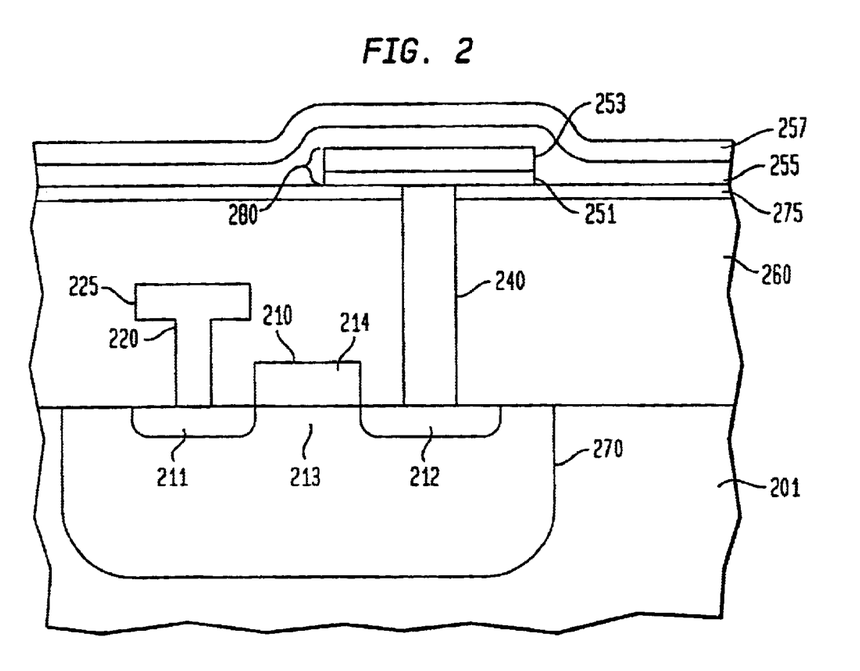
FIGS. 2 shows a cross-sectional view of one embodiment of the invention.

Referring to FIG. 2, a cross-section of a ferroelectric memory cell 100 in accordance with one embodiment of the invention is shown. The memory cell comprises a transistor 210 on a substrate 201 such as a semiconductor wafer. The transistor includes diffusion regions 211 and 212 separated by a channel 213, above which is located a gate 214. A gate oxide (not shown) separates the gate from the channel. The diffusion regions comprise dopants which are p-type or n-type. The type of dopants chosen is dependent upon the type of transistor desired. For example, n-type dopants such as arsenic (As) or phosphorus (P) are used for n-channel devices, and p-type dopants such as boron (B) are used for p-channel devices. Depending on the direction of current flow between the diffusion regions, one is referred to as the "drain" and the other the "source." The terms "drain" and "source" are herein used interchangeably to refer to the diffusion regions. Typically, the current flows from the source to drain. The gate represents a wordline, and one of the diffusion regions 211 is coupled to a bitline 225 by a contact plug 220.

A capacitor 150 is coupled to diffusion region 212 via a contact plug 240. The capacitor comprises bottom and top electrodes 253 and 257 separated by a metal oxide ceramic layer 255. The metal ceramic layer, in one embodiment, comprises a ferroelectric phase or is capable of transformation into a ferroelectric. The electrodes comprise a conductive material.

The composition or stoichiometry of the metal oxide ceramic layer can be tailored to cause a reduction in the amount of excess mobile specie that diffuses therefrom. By reducing the diffusion of the excess mobile specie, the metal oxide maintains a correct composition to achieve good electrical properties.

Additionally, the deposition parameters of the metal oxide ceramic can be controlled to reduce the amount of excess mobile specie diffusing out of the metal oxide ceramic. In one embodiment, the ratio of oxidizer to the precursor amount of oxidizer is reduced to reduce diffusion of the excess mobile specie.

An interlevel dielectric (ILD) layer 260 is provided to isolate the different components of the memory cell. The ILD layer comprises, for example, silicate glass such as silicon dioxide ($SiO_2$) or silicon nitride ($Si_3N_4$). Doped silicate glass such as borophosphosilicate glass (BPSG), borosilicate glass (BSG), or phosphosilicate glass (PSG) are also useful. Other types of dielectric materials can also be used.

In accordance with one embodiment of the invention, a barrier layer 275 is provided to act as a diffusion barrier for the excess mobile specie. In one embodiment, the barrier layer 275 is provided between the metal oxide ceramic layer and the substrate to reduce or minimize the diffusion of the excess mobile specie into the substrate. The barrier layer 275, for example, is formed on the ILD around the capacitor, protecting the substrate from the excess mobile specie.

Figure 3A:
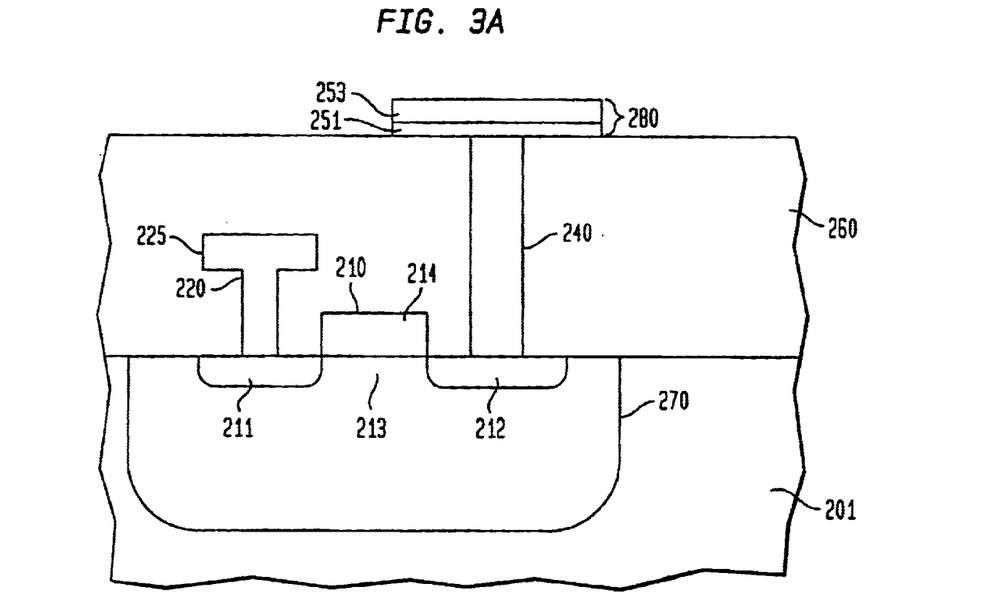
FIGS. 3a–b show a process for forming a device in accordance with one embodiment of the invention.
Figure 3B:
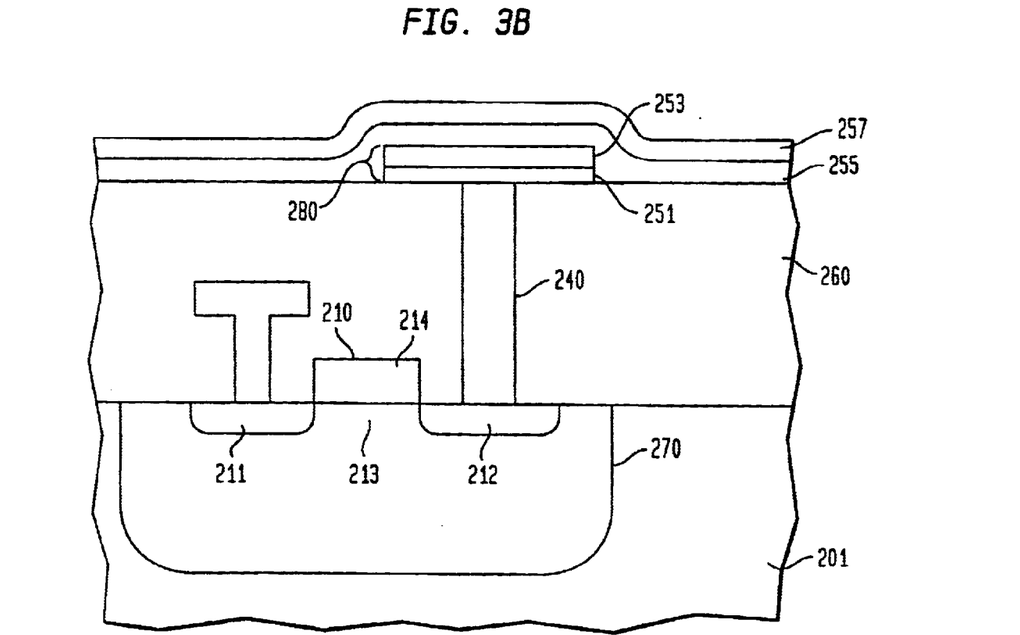

FIGS. 3a–b show a process for forming the memory cell in accordance with one embodiment of the invention. Referring to FIG. 3a, a substrate 201 comprising a partially formed device is shown. As shown, the substrate includes a transistor 210. The substrate, for example, is a semiconductor wafer comprising silicon. Other types of substrates such as germanium (Ge), gallium arsenide (GaAs), or other semiconductor compounds can also be used. Typically, the substrate is lightly doped with p-type dopants such as B. More heavily doped substrates are also useful. A heavily doped substrate with a lightly doped epitaxial (epi) layer such as a p−/p+ substrate can also be used. N-type doped substrates, including lightly doped, heavily doped, or heavily doped substrates with a lightly doped epi layer, are also useful.

A doped well 270 comprising dopants, if necessary, is provided to prevent punchthrough. The doped well is formed by selectively implanting dopants into the substrate in the region where the transistor is formed. In one embodiment, the doped well is formed by implanting p-type dopants such as B into the substrate. The p-type doped well (p-well) serves as a doped well for n-channel devices. The use of an n-type doped well (n-well) comprising, for example, As or P dopants is also useful for p-channel devices.

Diffusion regions 211 and 212 are formed by selectively implanting dopants having a second electrical type into the desired portions of the substrate. In one embodiment, n-type dopants are implanted into the p-type well used for n-channel devices, and p-type dopants are used for p-channel devices. An implant may also be performed to implant dopants into the channel region 213 between the diffusion regions to adjust the gate threshold voltage ($V_T$) of the transistor. Forming the diffusion regions after gate formation is also useful.

Various layers are deposited on the substrate and patterned to form a gate 214. The gate, for example, includes gate oxide and polycrystalline silicon (poly) layers. The poly is, for example, doped. In some cases, a metal silicide layer is formed over the doped poly, producing a polysilicon-silicide (polycide) layer to reduce sheet resistance. Various metal silicides, including molybdenum ($MoSi_x$), tantalum ($TaSi_x$), tungsten ($WSi_x$), titanium silicide ($TiSi_x$) or cobalt silicide ($CoSi_x$), are useful. Aluminum or refractory metals, such as tungsten and molybdenum, can be used alone or in combination with silicides or poly.

Contact plug 220 coupling diffusion region 211 to a bitline 225 and contact plug 240 coupled to diffusion region 212 can be formed after completion of the transistor using various known techniques such as, for example, single or dual damascene techniques. Reactive ion etch (RIE) techniques are also useful. A combination of damascene and etch techniques can also be used. The contact plugs comprise a conductive material such as doped poly or tungsten (W). Other conductive materials are also useful. The bitline, for example, comprises aluminum (Al) or other types of conductive materials. An ILD layer 260 isolates the different components of the memory cell.

Referring to FIG. 3b, the process continues to form the ferroelectric capacitor. A conductive electrode barrier layer 251 is deposited on the ILD layer. The electrode barrier prevents the passage of oxygen into the plug. The electrode barrier can prevent or reduce the migration of atoms between the contact plug 240 and the subsequently formed bottom electrode. The electrode barrier layer comprises, for example, titanium nitride (TiN). Other materials such as $IrSi_xO_y$, $CeO_2TiSi_2$, or $TaSiN_x$ are also useful.

A conductive layer 253 is deposited over the electrode barrier layer. The conductive layer 253 serves as the bottom electrode. Preferably, the bottom electrode comprises a conductive material that does not react with the subsequently deposited metal oxide ceramic film. In one embodiment, the bottom electrode comprises a noble metal such as Pt, Pd, Au, Ir, or Rh. Other materials such as conducting metal oxides, conducting metal nitrides, or super conducting oxides are also useful. Preferably, the conducting metal oxides, conducting metal nitrides, or super conducting oxides do not react with the ferroelectric layer. Conducting oxides include, for example, $IrO_x$, $RhO_x$, $RuO_x$, $OsO_x$, $ReO_x$, or $WO_x$ (where x is greater than about 0 and less than about 2). Conducting metal nitrides include, for example, $TiN_x$, $ZrN_x$ (where x is greater than about 0 and less than about 1.1), $WN_x$, or $TaN_x$ (where x is greater than about 0 and less than about 1.7). Super conducting oxides can include, for example, $YBa_2Cu_2O_{7-x}$, $Bi_2Sr_2Ca_2Cu_3O_x$, or $Bi_2Sr_2Ca_1Cu_2O_y$.

The electrode barrier and conductive layers are pattern to form a bottom electrode stack 280 that is coupled to contact stud 240. A metal oxide ceramic layer 255 is formed above the bottom electrode stack. In one embodiment, the metal oxide ceramic comprises a ferroelectric phase or is capable of transformation into a ferroelectric.

Various techniques, such as such as sol-gel, chemical vapor deposition (CVD), sputtering, pulsed laser deposition (PLD), and evaporation, are used to form the metal oxide ceramic layer. Preferably, the metal oxide ceramic layer is formed by CVD. Preferably, the metal oxide ceramic is deposited by low temperature CVD techniques. Low temperature techniques are described in co-pending U.S. patent application Ser. No. 08/975,087, titled "Low Temperature CVD Process using B-Diketonate Bismuth Precursor for the Preparation of Bismuth Ceramic Thin Films for Integration into Ferroelectric Memory Devices," which is herein incorporated by reference for all purposes. More preferably, the metal oxide ceramic layer is deposited in amorphous form using CVD. CVD amorphously deposited metal oxide layers are described in co-pending U.S. patent application Ser. No. 09/107,861, titled "Amorphously Deposited Metal Oxide Ceramic Films", which is herein incorporated by reference for all purposes.

In one embodiment, the metal oxide ceramic comprises a Bi-based metal oxide ceramic. The Bi-based metal oxide layer is generally expressed by $Y_aBi_bX_2O_c$, where Y comprises a 2-valent cation and X comprises a 5-valent cation.

In one embodiment, Y is equal to one or more elements selected from Sr, Ba, Pb, and Ca. X, in one embodiment, is equal to one or more elements selected from Ta and Nb. The subscript "a" refers to the number of Y atoms for every 2X atoms; subscript "b" refers to the number of Bi atoms for every 2X atoms; and subscript "c" refers to the number of oxygen atoms for every 2X atoms.

The ferroelectric Bi-based metal oxide ceramic preferably comprises a layered perovskite structure having negatively charged perovskite layers $[A_{m-1}B_mO_{3m+1}]^{2-}$ separated by positively charged Bi oxide layers $[Bi_2O_2]^{2n+}$, where $A=Bi^{3+}$, $L^{3+}$, $L^{2+}$, $Ca^{2+}$, $Sr^2$, $Ba^{2+}$, $Na^+$ (L=metal from the lanthanide series such as $Ce^{4+}$, $La^{3+}$, $Pr^{3+}$, $Ho^{3+}$, $Eu^{2+}$, $Ub^{2+}$); $B=Fe^{3+}$, $Al^{3+}$, $Y^{3+}$, $L^{3+}$. $Ti^{4+}$, $Nb^{5+}$, $Ta^{5+}$, $W^{6+}$, $Mo^{6+}$, and m=1,2,3,4,5.

In one embodiment, the Bi-based oxide ceramic comprises Sr. A Bi-based oxide comprising Sr and Ta is also useful. Preferably, the Bi-oxide comprises SBT expressed generally by $Sr_aBi_bTa_2O_c$. The SBT can be more specifically expressed by, for example, the $SrBi_2Ta_2O_9$. The ferroelectric SBT comprises a layered perovskite structure having negatively charged perovskite layers of Sr and Ta oxide separated by positively charged Bi oxide layers. The stoichiometry of the Sr and Ta oxide is for example $[SrTa_2O_7]^{2n-}{}_n$, and the stoichiometry of the Bi oxide layers is for example $[Bi_2O_2]^{2n+}{}_n$, creating a structure of alternating $[SrTa_2O_7]^{2n-}{}_n$ and $[Bi_2O_2]^{2n+}{}_n$ layers.

Derivatives of SBT are also useful. SBT derivatives include $Sr_aBi_bTa_{2-x}Nb_xO_c$ (0<x<2), $Sr_aBi_bNb_2O_c$, $Sr_aBi_bTa_2O_c$, $Sr_{a-x}Ba_xBi_bTa_{2-y}Nb_yO_c$ (0≤x≤a, 0≤y≤2), $Sr_{a-x}Ca_xBi_bTa_{2-y}Nb_yO_9$ (0≤x≤a, 0≤y≤2), $Sr_{a-x}Pb_xBi_bTa_{2-y}Nb_yO_c$ (0≤x≤a, 0≤y≤2), or $Sr_{a-x-y-z}Ba_xCa_yPb_zBi_bTa_{2-p}Nb_pO_c$ (0≤x+y+z≤a, 0≤p≤2). Substituting or doping the Bi-based oxides or SBT derivatives with a metal of the lanthanide series is also useful.

In another embodiment, the Bi-based oxide ceramic comprises $Bi_4Ti_3O_{12}$ or its derivatives. Derivatives of $Bi_4Ti_3O_{12}$ include, for example, $PrBi_3Ti_3O_{12}$, $HoBi_3Ti_3O_{12}$, $LaBi_3Ti_3O_{12}$, $Bi_3TiTaO_9$, $Bi_3TiNbO_9$, $SrBi_4Ti_4O_{15}$, $CaBi_4Ti_4O_{15}$, $BaBi_4Ti_4O_{15}$, $PbBi_4Ti_4O_{15}$, $Sr_{1-x-y-z}Ca_xBa_yPb_zBi_4Ti_4O_{15}$ (0≤x≤1, 0≤y≤1, 0≤z≤1), $Sr_2Bi_4Ti_5O_{18}$, $Ca_2Bi_4Ti_5O_{18}$, $Ba_2Bi_4Ti_5O_{18}$, $Pb_2Bi_4Ti_5O_{18}$, $Sr_{2-x-y-z}Ca_xBa_yPb_zBi_5Ti_4FeO_{18}$ (0≤x≤2, 0≤y≤2, 0≤z≤2), $SrBi_5Ti_4FeO_{18}$, $CaBi_5Ti_4FeO_{18}$, $BaBi_5Ti_4FeO_{18}$, $PbBi_5Ti_4FeO_{18}$, $Sr_{1-x-y-z}Ca_xBa_yPb_zBi_5Ti_4FeO_{18}$ (0≤x≤1, 0≤y≤1, 0≤z≤1), $Bi_5Ti_3FeO_{15}$, $LaBi_4Ti_3FeO_{15}$, $PrBi_4Ti_3FeO_{15}$, and $Bi_6Ti_3FeO_{18}$, $Bi_9Ti_3Fe_5O_{27}$.

In one embodiment, the Bi-based metal oxide ceramic is deposited by low temperature CVD techniques. In a preferred embodiment, the Bi-based metal oxide is deposited amorphously by CVD. The temperature at which the Bi-based metal oxide is deposited is, for example about 430° C. or less and preferably about 385–430° C.

Precursors and reactive gases employed to form the Bi-based oxide ceramic are described in co-pending U.S. patent applications Ser. No. 08/975,087, titled "Low Temperature CVD Process using B-Diketonate Bismuth Precursor for the Preparation of Bismuth Ceramic Thin Films for Integration into Ferroelectric Memory Devices," filed on Nov. 20, 1997; U.S. Ser. No. 08/960,915, titled "Anhydrous Mononuclear Tris(Beta-Diketonate) Bismuth Compositions and Method of Making the Same," filed on Oct. 30, 1997; U.S. Ser. No. 09/107,861 "Amorphously Deposited Metal Oxide Ceramic Films," filed on Jun. 30, 1998; all of which are all herein incorporated by reference for all purposes.

The precursors can be individually dissolved in a solvent system and stored in a respective reservoir of the delivery subsystem. The precursors are mixed in the correct ratio prior to deposition. Mixing the precursors in a single reservoir is also useful. The precursors should be highly soluble in the solvent system. The solubility of the precursors in the solvent system is, for example, about 0.1–5M. Solubility of about 0.1–2M or about 0.1–1M is also useful.

The composition of the Bi-based metal oxide can be tailored to reduce diffusion of the mobile specie. The mobile specie of the Bi-based metal oxide ceramic comprises Bi such as, for example, Bi or $Bi_2O_3$. From experiments, it has been found that the composition of the Bi-based metal oxide ceramic layer influences the amount of mobile specie (Bi) that diffuses out of the layer. In particular, a Bi-based metal oxide ceramic layer comprising a composition having a Bi ratio to 2×(b in the formula $Y_aBi_bX_2O_c$) of greater than 2.4 results in significant Bi loss or diffusion.

In one embodiment, the Bi-based metal oxide ceramic comprises a composition wherein b is less than or equal to about 2.4 to reduce diffusion of the excess mobile specie. Preferably, the composition of the metal oxide ceramic layer comprises a value of b of about 1.95 to 2.2 and more preferably about 2.0 to 2.2.

The content of Y molecules also influence Bi loss from the Bi-based metal oxide ceramic. It is believed that decreasing that amount of Y atoms (e.g., Y deficient composition) provides additional sites for the Bi atoms to occupy, thereby reducing the amount of Bi that can diffuse out of the metal oxide ceramic layer. This is also advantageous as the resulting layer comprises a structure which produces good electrical properties. In one embodiment, the composition of the metal oxide ceramic layer comprises a Y to 2× ratio (a in the formula $Y_aBi_bX_2O_c$) of about 0.8 to 1.0. A value of a equal to about 0.9–1.0 has also been found to be useful in reducing the diffusion of the excess mobile specie and without degrading the electrical properties of the Bi-based metal oxide ceramic layer.

In a preferred embodiment, the Bi-based metal oxide ceramic comprises SBT. The SBT comprises a b value of less than about 2.4. In one embodiment, the composition of the SBT comprises a b value of about 1.95 to 2.2, preferably about 2.0 to 2.2. The Sr to 2Ta (a) ratio of the SBT is about 0.8 to 1.0.

An anneal is performed after the formation of the metal oxide ceramic layer. The anneal transforms the as-deposited metal oxide ceramic into a layer having the desired electrical characteristics. In one embodiment, the anneal transforms the as-deposited metal oxide into the ferroelectric phase. The anneal also grows the grains of the ferroelectric phase to produce good electrical properties, such as high 2Pr. The anneal is typically performed at about 750–800° C. for about 1–60 minutes in an oxygenated ambient. Lower temperatures are also useful. For example, the anneal can be performed at about 650–750° C. Lower temperatures, however, may require a longer anneal (e.g., about 30–120 minutes) to achieve the desired electrical properties. The duration of the anneal can vary depending on the electrical properties desired.

A conductive layer 257 is deposited over the metal oxide ceramic layer to form the top electrode. The conductive layer comprises, for example, a noble metal such as Pt, Pd, Au, Ir, or Rh. Other materials such as those used to form the bottom electrode are also useful. It is often useful to perform an anneal after the deposition of the top electrode to ensure a well define interface between the metal oxide ceramic and electrode. The anneal to recover the interface between the metal oxide ceramic and electrode can be typically performed at about 500–800° C. for about 1–30 minutes in oxygen ambient with $O_2$ flow rate of about 5 slm. Having a well-defined interface between the electrode and metal oxide ceramic is advantageous as this reduces, for example, leakage currents.

Performing a pre-anneal after the deposition of the metal oxide ceramic to partially or fully form the to ferroelectric phase, and then performing another anneal after the deposition of the top electrode to fully transform the metal oxide ceramic into the ferroelectric phase if it has not already been fully transformed, to promote grain growth, and to ensure a well defined metal oxide ceramic/electrode interface can also be useful.

The pre-anneal typically is performed at a temperature of less than about 750° C. In one embodiment, the pre-anneal is performed at about 700–750° C. The duration of the pre-anneal is about 5–10 minutes. In another embodiment, the pre-anneal is performed at less than 700° C. At lower temperatures, a longer per-anneal may be required to partially or fully transform the metal oxide ceramic into the ferroelectric phase.

The top electrode typically serves as a common electrode, connecting other capacitors in the memory array. The top electrode, along with the other layers underneath, can be patterned as necessary to provide contact openings to the bitlines and wordlines. Additional processing is performed to complete the ferroelectric memory IC. Such additional processing is known in the art. For example, the additional processing includes forming support circuitry, final passivation layer, contact openings in the passivation layer for testing and connecting to lead frame, and packaging.

Figure 4A:
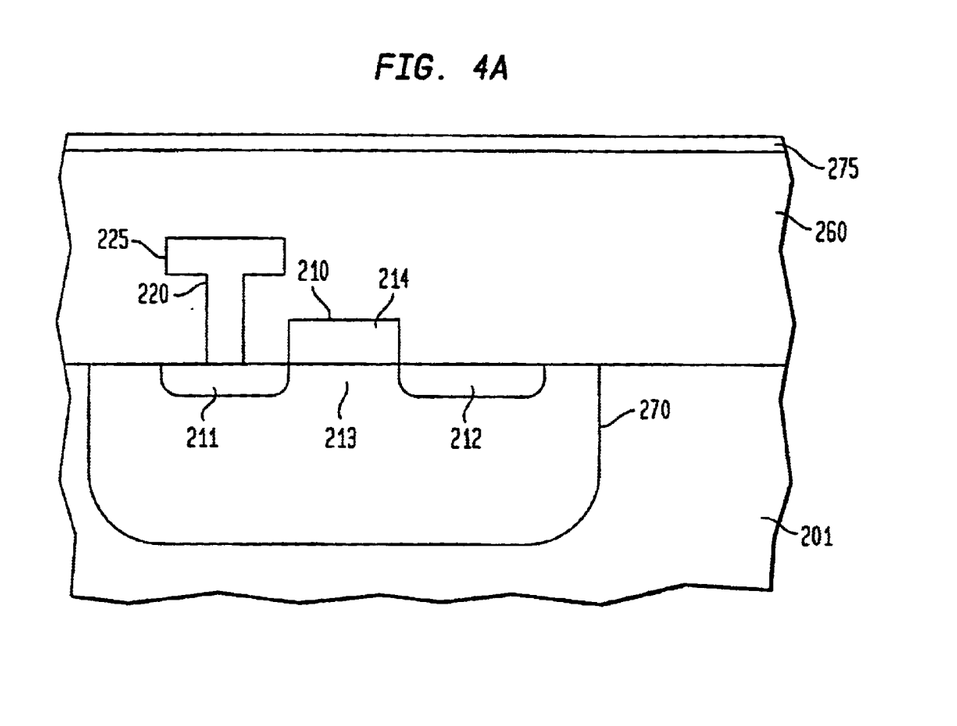
FIGS. 4a–4d show processes for forming alternative embodiments of the invention.
Figure 4B:
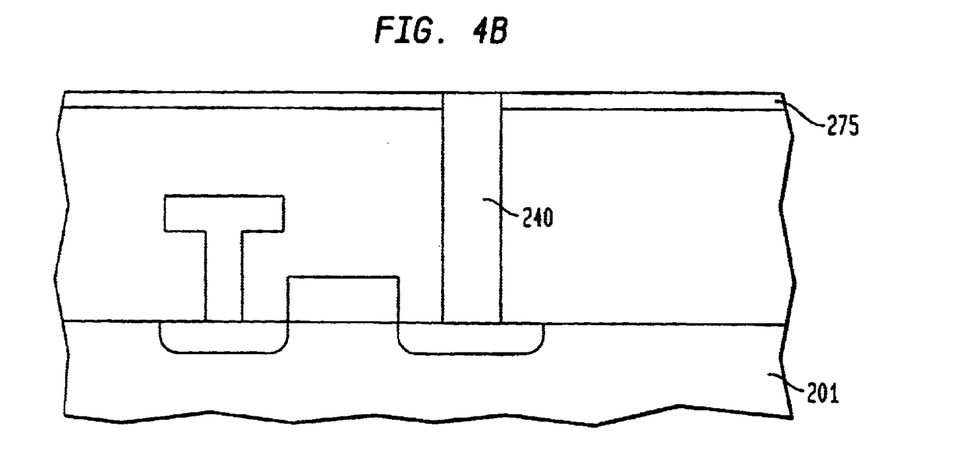
Figure 4C:
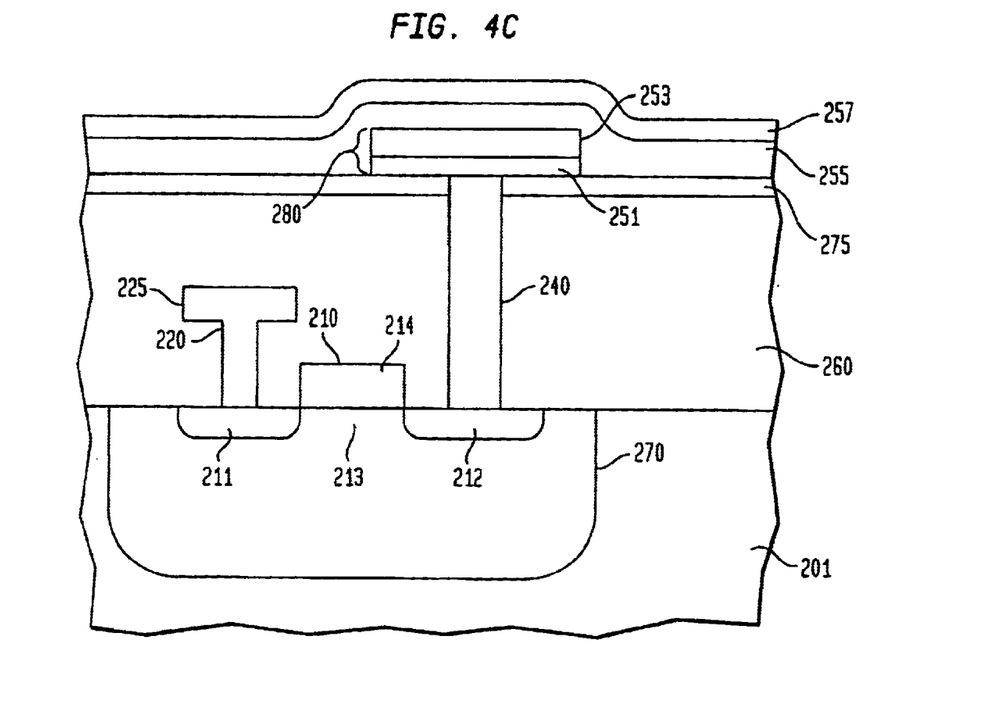

FIGS. 4a–c shows another embodiment of the invention. As shown, a substrate 201 comprises a partially formed memory cell similar to that already described, with similar reference numbers designating similar features.

A barrier layer 275 is deposited over the ILD layer 260. In one embodiment, the barrier layer comprises a material which reacts with the excess mobile specie. In the case of a Bi-based metal oxide ceramic, the barrier layer comprises an oxide that reacts with the Bi mobile specie. In one embodiment, the barrier layer comprises an oxide selected from the group containing early transitional metals. Such oxides include, for example, $Sc_2O_3$, $Y_2O_3$, $TiO_2$, $ZrO_2$, $HfO_2$, $V_2O_5$, $Nb_2O_5$, $Ta_2O_5$, and $TiO_2$. In a preferred embodiment, the barrier layer comprises $TiO_2$, and $Ta_2O_5$. In another embodiment, the barrier layer comprises a transitional metal oxide combined with a lanthanide oxide such as $Pr_2O_3$, $Ho2O_3$, or $La_2O_3$ to form respective barrier layers $PrBi_3Ti_3O_{12}$, $HoBi_3Ti_3O_{12}$, and $LaBi_3Ti_3O_{12}$ after the reaction with the Bi-containing excess mobile specie.

In another embodiment, the barrier layer comprises a titanate (Ti) having the generic formula $MTiO_3$, where M=Ca, Sr, and Ba. Titanates such as, for example, $SrTiO_3$, $BaTiO_3$, (Ba, Sr)$TiO_3$ are useful. Also oxides selected from the group of oxides comprising alkaline earth metals can be used to form the barrier layer. Such oxides include, for example, MgO, CaO, SrO, and BaO.

Other materials that react with the Bi-mobile specie, such as nitrides comprising transitional metals, can also be used to form the barrier layer. Transitional metal nitrides include, for example, $TiN_x$, $ZrN_x$, and $HfN_x$ with $0<x<1$; $TaN_x$, and $NbN_x$ with $0<x<1.5$; $WN_x$ and $MoN_x$ with $0<x<2$. The nitride is oxidized to form a non-conducting barrier layer.

In another embodiment, the barrier comprises a dense material that reduces the migration of the excess mobile specie from the metal oxide ceramic into the substrate.

Materials that are sufficiently dense, in the case of Bi-based metal oxide ceramics, to reduce the diffusion of Bi mobile specie include oxides such as $Al_2O_3$, $Sc_2O_3$, $Y_2O_3$, MgO, BeO, $TiO_2$, and $Ta_2O_5$.

The barrier layer can be formed by various deposition techniques, such as sputtering, CVD, or physical vapor deposition (PVD). Other deposition techniques can also be useful. In one embodiment, the barrier layer is deposited on the substrate by sputtering using, for example, an oxide target or a metal target in the presence of oxygen. Typically, the temperature at which the barrier layer is sputtered is about 200–400° C. Lower sputtering temperatures such as, for example, of about 20–200° C. and preferably about 200° C. results in finer grains, which can be advantageous because the they extend the diffusion pathways of the mobile specie. Higher temperatures, such as greater than 400° C. can also be useful.

In a preferred embodiment, the barrier layer is deposited in metallic form by sputtering or CVD. After deposition, the barrier layer is annealed in oxygen to transform the as-deposited layer into an oxide barrier layer. The anneal, due to oxidation, leads to expansion of the as-deposited layer, thereby increasing its density.

In some cases, the expansion can create an excessive mount of compressive stress. To counter the effects of the compressive stress, the barrier layer can be deposited under tensile stress. Tensile stress can be induced by depositing the barrier layer at elevated temperatures of about, for example, 200–400° C.

Alternatively, the barrier layer can be deposited with a deficient oxygen content to form a mixture of oxide and metal or suboxide. An anneal is then performed in oxygen to oxidized the barrier layer. Since the as-deposited film comprises a suboxide (a metal having an oxidation state that is less than its highest oxidation state) or a mixture or oxide and metal, the amount of volume expansion is less, thereby decreasing the compressive stress.

In one embodiment, the barrier layer comprises a Ti-suboxide. The stoichiometry of the Ti-suboxide is, for example, $TiO_x$ where x is $0.5 \leq x \leq 1.5$. During the anneal, the suboxide transforms into $TiO_2$. The reaction can be described as:

$TiO_2$: $TiO_x + yO_2 \rightarrow TiO_2$ with $y=(2-x)/2$.

A barrier layer comprising Ta-suboxide is also useful. The Ta-suboxide can be expressed as $TaO_x$ and where x is about $0.5 \leq x \leq 2$.

In another embodiment, the barrier layer comprises a barrier stack having first and second barrier layers. The first barrier layer comprises a material having a small diffusion constant for the mobile specie, and the second barrier layer comprises a material having high reactivity with the mobile specie. The second barrier layer tends to attract the mobile specie with which it reacts to form a stable compound. The first barrier layer, on the other hand, prevents the passage of the mobile specie due to its denseness.

In one embodiment, the second barrier layer is formed above the first barrier layer. The excess mobile specie reacts with the second barrier layer and becomes trapped therein. The first barrier layer below prevents the passage of excess mobile specie due to its denseness.

Referring to FIG. 4b, the barrier and ILD layers are patterned to form an opening to diffusion region 212. A conductive material is deposited, filling the opening. The excess conductive material can be removed by, for example, a chemical mechanical polish (CMP) to form a contact plug 240.

Referring to FIG. 4c, a conductive layer 253 serving as a bottom electrode is deposited on the substrate, covering the barrier layer and contact plug 240. A conductive electrode barrier layer 251 can be formed on the substrate prior to the formation of the conductive layer to prevent the passage of oxygen into the plug 240. The electrode barrier layer can also serve to reduce migration of atoms between the contact plug and the electrode. The electrode barrier and conductive layers are patterned to form a bottom electrode stack 280. The bottom electrode is coupled to the diffusion region 212 by contact plug 240.

A metal oxide ceramic layer 255 is formed over the bottom electrode and ILD layer. The metal oxide ceramic, in one embodiment, comprises a ferroelectric phase or is capable of transformation into a ferroelectric. As previously described, the composition of the metal oxide ceramic can be tailored to reduce diffusion of the excess mobile specie.

An anneal is performed to transform the metal oxide ceramic into the desired phase with good electrical properties. A conductive layer 257 is deposited over the metal oxide ceramic to form the top electrode. Performing the anneal after the formation of the top electrode 257 can also be useful. Alternatively, a pre-anneal is performed after the deposition of the metal oxide ceramic to form the ferroelectric phase, and then an anneal is performed after the formation of the top electrode to achieve the desired electrical properties.

The top electrode typically serves as a common electrode, connecting other capacitors in the memory array. The top electrode, along with the other layers underneath, can be patterned as necessary to provide contact openings to the bitlines and wordlines. Additional processing is performed to complete the ferroelectric memory IC.

Figure 4D:
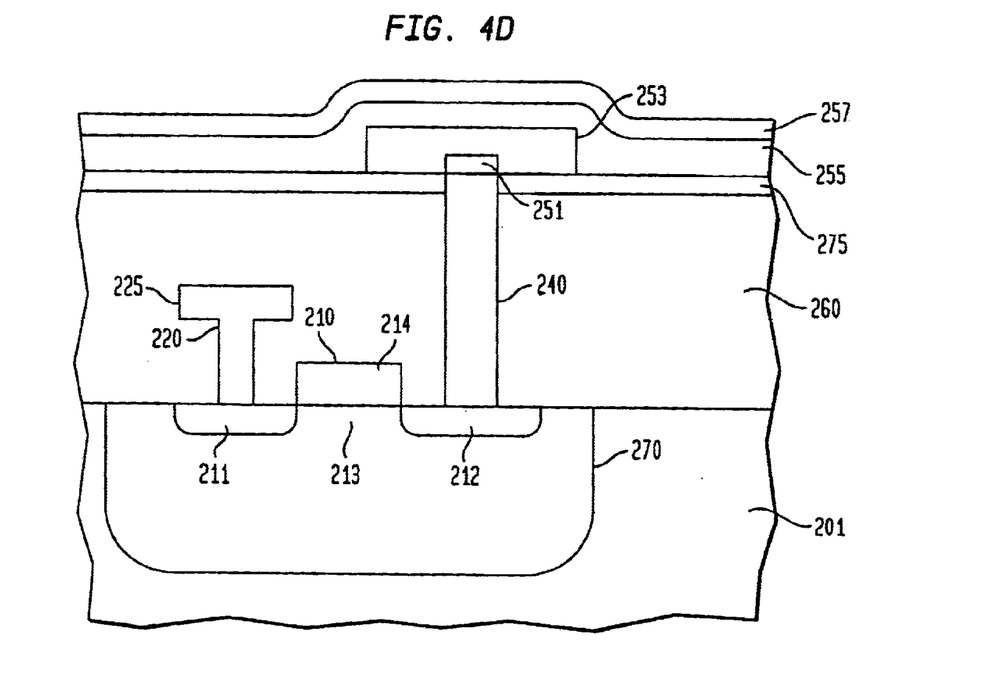

Alternatively, as shown in FIG. 4d, an electrode barrier layer is deposited over the ILD layer and patterned to form the electrode barrier 251 on top of the plug 240. A conductive material is deposited and patterned to form the bottom electrode 253. The bottom electrode covers the electrode barrier 251 and a portion of the barrier layer 275. The process continues as described in FIG. 4c.

Figure 5A:
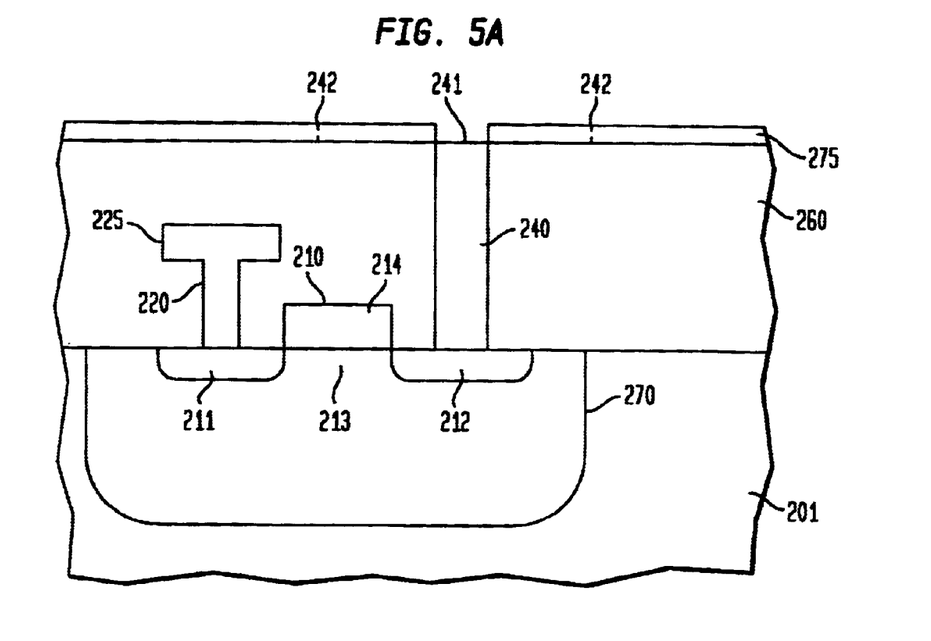
FIGS. 5a–5c show a process for forming another embodiment of the invention.
Figure 5B:
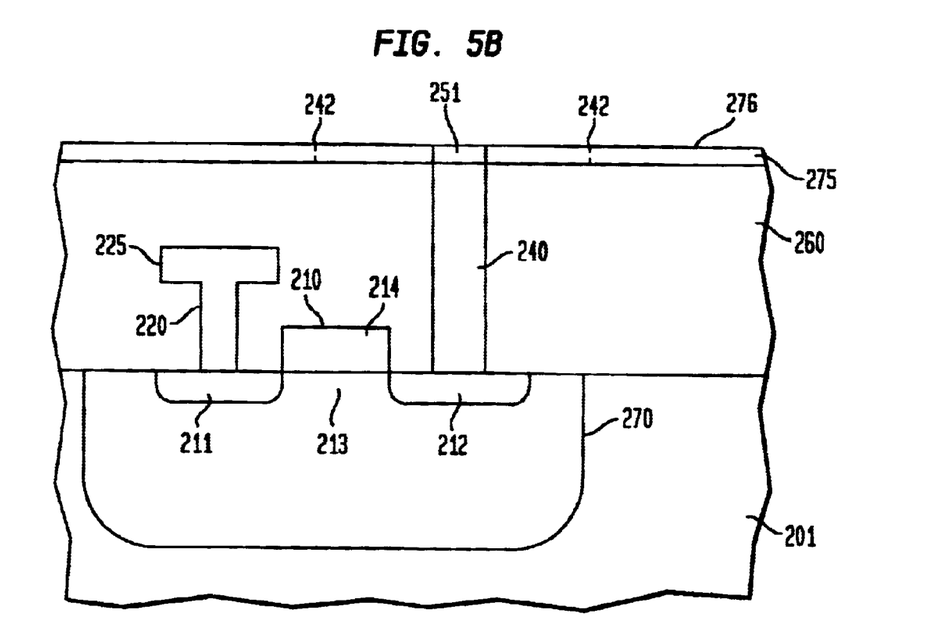
Figure 5C:
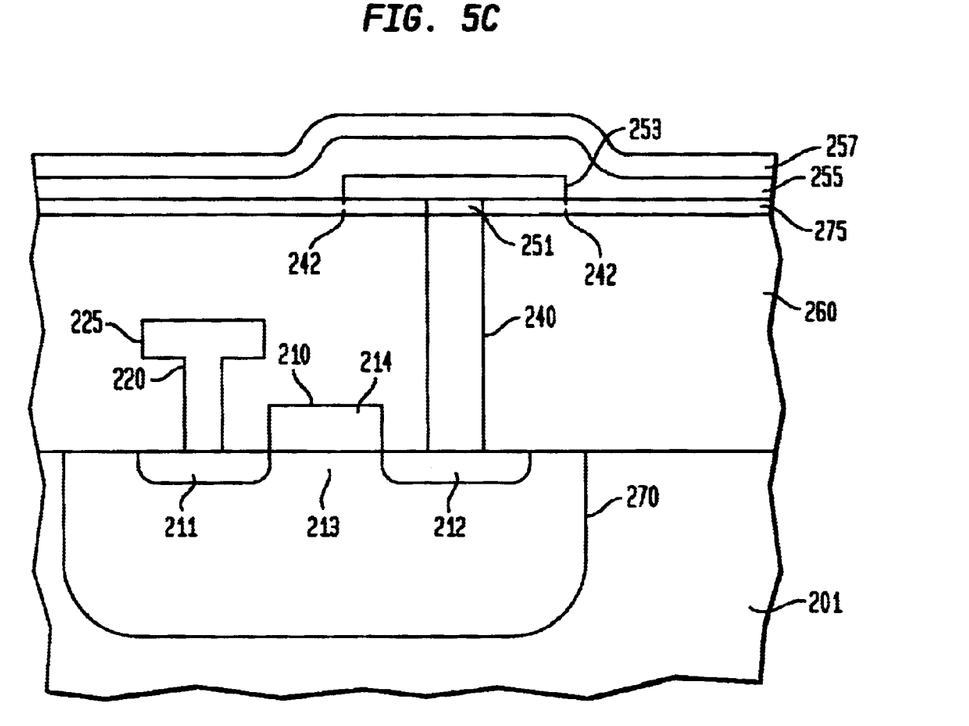

FIGS. 5a–c shows another embodiment of the invention. As shown, a substrate 201 comprises a partially formed memory cell as previously described. A barrier layer 275 in accordance with the invention is formed over the substrate surface. The barrier layer is patterned using conventional masking and etching processes to form an opening 241, exposing the surface of the contact plug. As shown, the opening 241 exposes only the surface of the plug 240. Providing an opening 241 that also exposes a portion of the ILD layer, as depicted by the dotted lines 242, is also useful. For example, the opening can be the size of the subsequently formed bottom electrode. Other techniques for removing excess electrode barrier material can also be used.

Referring to FIG. 5b, an electrode barrier layer is deposited over substrate, covering the barrier 275 and exposed plug 240. The substrate surface can be planarized by CMP to remove excess electrode barrier material from the surface of the barrier layer 275 to form electrode barrier 251. The CMP produces a planar top surface 276.

Referring to FIG. 5c, a conductive layer 253 is deposited over substrate surface and patterned to form a bottom electrode. A metal oxide ceramic layer 255 is deposited over substrate, covering the electrode and barrier layer 275. The composition can be tailored to reduce the amount of excess mobile specie that diffuses out.

An anneal is performed to transform the metal oxide ceramic into the desired phase with good electrical properties. A conductive layer 257 is deposited over the metal oxide ceramic to form the top electrode. Alternatively, a pre-anneal is performed after the deposition of the metal oxide ceramic to partially or fully form the ferroelectric phase, and then an anneal is performed after the formation of the top electrode to, if necessary, fully transform the metal oxide ceramic into the ferroelectric phase, to promote grain growth to achieve the desired electrical properties, and to ensure a well-defined metal oxide ceramic/electrode interface. Additional processing is performed to complete the ferroelectric memory IC.

Figure 6A:
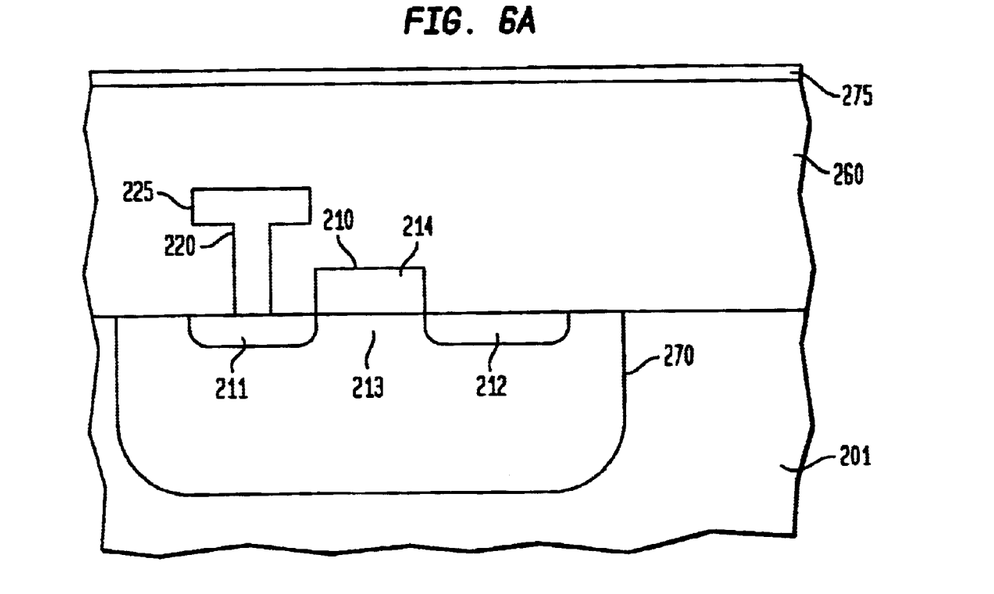
FIGS. 6a–6b show a process for forming an alternative embodiment of the invention.
Figure 6B:
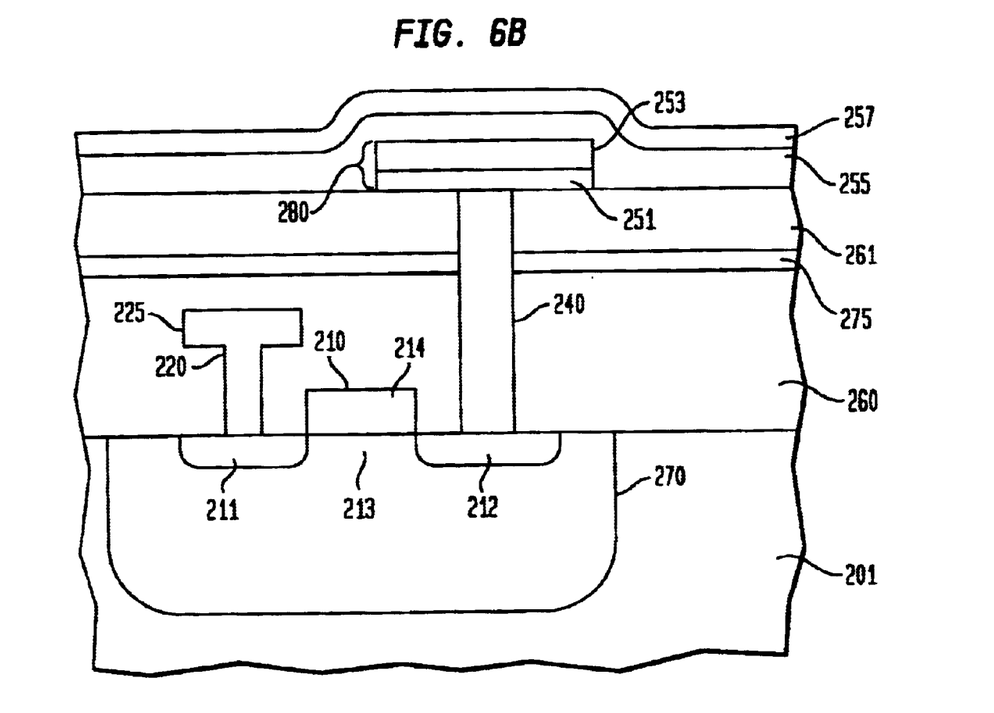

FIGS. 6a–b shows another embodiment of the invention. Referring to FIG. 6a, a substrate 201 comprises a partially formed memory cell as previously described. A barrier layer 275 in accordance with the invention is deposited over the ILD 260.

Referring to FIG. 6b, an additional ILD layer 261 is formed over the barrier layer 275. The additional ILD layer, although not necessary, can be formed from the same material as the ILD layer 260. Next, the contact plug 240 is formed by pattering the ILD layer 261 and layers thereunder to expose the diffusion region 212. A conductive material is deposited, filling the opening. Excess conductive material can be removed by, for example, a chemical mechanical polish (CMP) to form a contact plug 240.

An electrode barrier layer 251 and conductive layer 253 are deposited on the substrate and patterned to form a bottom electrode stack 280. The bottom electrode stack is coupled to the diffusion region 212 by contact plug 240.

A metal oxide ceramic layer 255 is deposited over substrate, covering the electrode and ILD layer 261. The composition of the metal oxide ceramic can be tailored to reduce the amount of excess mobile specie that diffuses out.

An anneal is performed to transform the metal oxide ceramic into the desired phase with good electrical properties. A conductive layer 257 is deposited over the metal oxide ceramic to form the top electrode. Alternatively, a pre-anneal is performed after the deposition of the metal oxide ceramic to partially or fully form the ferroelectric phase, and then an anneal is performed after the formation of the top electrode to, if necessary, fully transform the metal oxide ceramic into the ferroelectric phase, to promote grain growth to-achieve the desired electrical properties, and to ensure a well-defined metal oxide ceramic/electrode interface. Additional processing is performed to complete the ferroelectric memory IC.

Figure 7A:
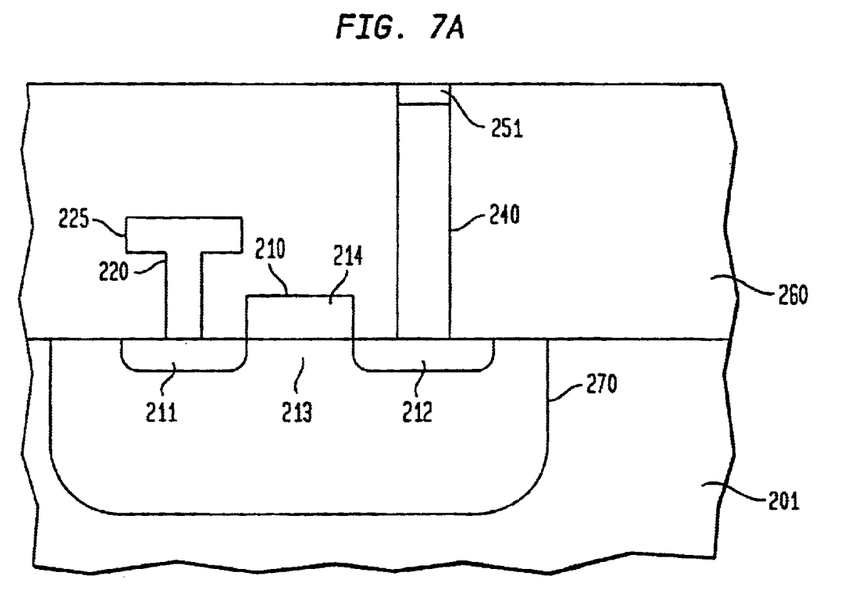
FIGS. 7a–7b show a process for forming alternative embodiments of the invention.
Figure 7B:
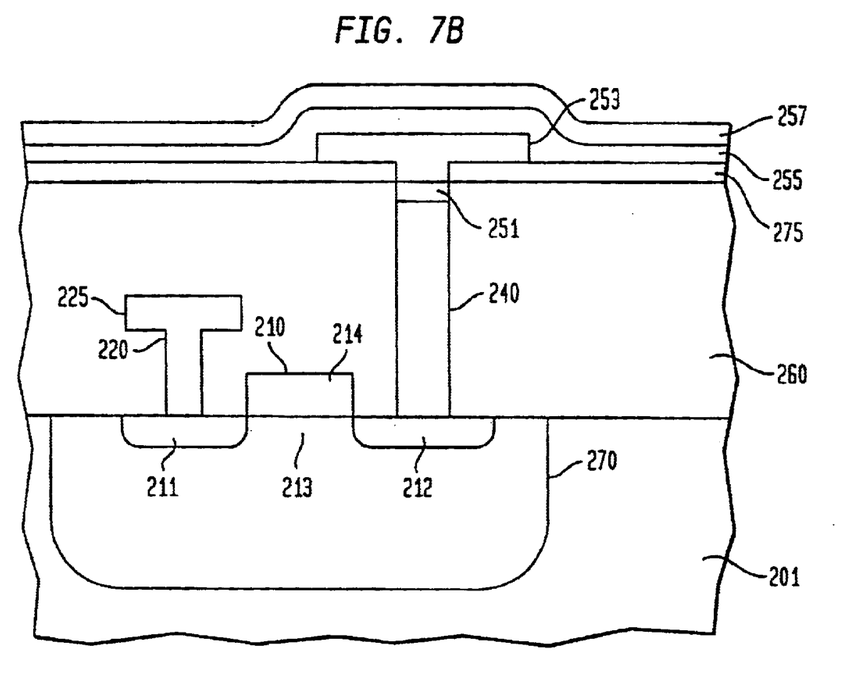

FIGS. 7a–b shows yet another embodiment of the invention. Referring to FIG. 7a, a substrate 201 comprises a partially formed memory cell as previously described. As shown, the surface of the plug 240 is recessed below the surface of the ILD layer 260. An electrode barrier layer is formed over the substrate, covering the substrate and filling the recess. Excess material is removed by, for example, CMP, leaving the electrode barrier 251 above the plug. Other techniques for removing the excess material are also useful.

Referring to FIG. 7b, a barrier layer 275 in accordance with the invention is deposited over the substrate, covering the ILD and electrode barrier. The barrier layer is patterned, exposing the electrode barrier. A conductive layer 253 is deposited on the substrate and patterned to form the bottom electrode.

A metal oxide ceramic layer 255 is deposited over substrate, covering the electrode and barrier layer 275. The composition of the metal oxide ceramic can be tailored to reduce the amount of excess mobile specie that diffuses out. An anneal is performed to transform the metal oxide ceramic into the desired phase with good electrical properties. A conductive layer 257 is deposited over the metal oxide ceramic to form the top electrode. A anneal is then performed to ensure a well defined metal oxide ceramic/electrode interface.

Alternatively, a pre-anneal is performed after the deposition of the metal oxide ceramic to partially or fully form the ferroelectric phase, and then an anneal is performed after the formation of the top electrode to, if necessary, fully transform the metal oxide ceramic into the ferroelectric phase, to promote grain growth to achieve the desired electrical properties, and to ensure a well-defined metal oxide ceramic/electrode interface. Additional processing is performed to complete the ferroelectric memory IC.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A semiconductor device comprising:
a dielectric layer on a substrate;
a conductive layer formed on a portion of the dielectric layer;
a metal oxide ceramic layer over the dielectric layer and the conductive layer, wherein the metal oxide ceramic comprises a Bi-based metal oxide ceramic and wherein the excess mobile specie comprises Bi; and
a barrier layer on the dielectric layer to separate the metal oxide ceramic and the substrate, the barrier layer reduces the diffusion of excess mobile specie from the metal oxide ceramic into the substrate, wherein the barrier layer comprises a material that reacts with the Bi-containing excess mobile specie, and wherein the barrier layer comprises an oxide selected from the group comprising $Pr_2O_3$, $Ho2O_3$, and $La2O_3$, to respectively form $PrBi_3Ti_3O_{12}$, $HoBi_3Ti_3O_{12}$, and $LaBi_3Ti_3O_{12}$ after reacting with the excess mobile specie.

2. A semiconductor device comprising:
a dielectric layer on a substrate;
a conductive layer formed on a portion of the dielectric layer;
a metal oxide ceramic layer over the dielectric layer and the conductive layer, wherein the metal oxide ceramic comprises a Bi-based metal oxide ceramic and wherein the excess mobile specie comprises Bi; and
a barrier layer on the dielectric layer to separate the metal oxide ceramic and the substrate, wherein the barrier layer comprises a material that reacts with the Bi-containing excess mobile specie to reduce the diffusion of the excess mobile specie from the metal oxide ceramic into the substrate, and wherein the barrier layer comprises an oxide selected from the group comprising $SrTiO_3$, $BaTiO_3$, and $(Ba, Sr)TiO_3$.

3. A semiconductor device comprising:
a dielectric layer on a substrate;
a conductive layer formed on a portion of the dielectric layer;
a metal oxide ceramic layer over the dielectric layer and the conductive layer, wherein the metal oxide ceramic comprises a Bi-based metal oxide ceramic and wherein the excess mobile specie comprises Bi;
a barrier layer on the dielectric layer to separate the metal oxide ceramic and the substrate, wherein the barrier layer comprises a material that reacts with the Bi-containing excess mobile specie to reduce the diffusion of the excess mobile specie from the metal oxide ceramic into the substrate, and wherein the barrier layer comprises an oxide selected from the group comprising MgO, CaO, SrO, and BaO.

4. A semiconductor device comprising:

a dielectric layer on a substrate;

a conductive layer formed on a portion of the dielectric layer;

a metal oxide ceramic layer over the dielectric layer and the conductive layer, wherein the metal oxide ceramic comprises a Bi-based metal oxide ceramic and wherein the excess mobile specie comprises Bi; and a barrier layer on the dielectric layer to separate the metal oxide ceramic and the substrate, the barrier layer reduces the diffusion of excess mobile specie from the metal oxide ceramic into the substrate, wherein the barrier layer comprises a barrier stack including first and second barrier layers, the first barrier layer comprises a small diffusion constant for the excess mobile specie, and the second barrier layer comprises a high reactivity with the mobile specie.

5. The semiconductor device of claim 4 wherein the first barrier layer is above the dielectric layer and the second barrier layer is above the first barrier layer.

6. The semiconductor device of claim 5 wherein the second barrier layer attracts the mobile specie to form a stable material and the first barrier layer blocks the excess mobile specie from passing due to its denseness.

* * * * *